United States Patent [19]

Suzuki et al.

[11] Patent Number: 5,731,720
[45] Date of Patent: Mar. 24, 1998

[54] SEMICONDUCTOR INTEGRATED CIRCUIT DEVICE CAPABLE OF REDUCING POWER CONSUMPTION

[75] Inventors: Takaaki Suzuki, Kawasaki; Makoto Niimi, Kasugai; Hideaki Kawai, Kawasaki; Masato Kaida, Satsuma-gun, all of Japan

[73] Assignees: Fujitsu Limited, Kawasaki; Fujitsu VLSI Limited, Kasugai; Kyushu Fujitsu Electronics Limited, Satsuma-gun, all of Japan

[21] Appl. No.: 784,539

[22] Filed: Jan. 21, 1997

Related U.S. Application Data

[63] Continuation of Ser. No. 507,686, Jul. 25, 1995, abandoned, which is a continuation of Ser. No. 272,615, Jul. 11, 1994, abandoned, which is a continuation of Ser. No. 99,423, Jul. 30, 1993, abandoned.

[30] Foreign Application Priority Data

Oct. 29, 1992 [JP] Japan ........................ 4-291391

[51] Int. Cl.$^6$ ........................ H03K 17/30
[52] U.S. Cl. ........................ 327/77; 327/80; 327/143
[58] Field of Search ........................ 307/360, 362, 307/363, 296.3, 296.5, 296.6, 296.8, 573, 571; 327/77–81, 88, 58, 62, 142, 143, 198, 544; 365/227

[56] References Cited

U.S. PATENT DOCUMENTS

| | | | |
|---|---|---|---|
| 4,321,489 | 3/1982 | Higuchi et al. | 307/362 |
| 4,477,736 | 10/1984 | Onishi | 307/296.8 |
| 4,504,743 | 3/1985 | Aoyama et al. | 307/571 |
| 4,682,051 | 7/1987 | Arakawa | 327/78 |
| 4,709,165 | 11/1987 | Higuchi et al. | 307/296.5 |
| 4,808,852 | 2/1989 | Kousaka et al. | 307/363 |
| 4,812,680 | 3/1989 | Kawashima et al. | 307/362 |
| 4,825,018 | 4/1989 | Okada et al. | 307/362 |
| 4,882,506 | 11/1989 | Johanson et al. | 307/360 |
| 4,922,133 | 5/1990 | Iwahashi et al. | 307/360 |
| 5,019,772 | 5/1991 | Dreibelbis et al. | 307/362 |
| 5,072,131 | 12/1991 | Nakano | 307/360 |
| 5,075,572 | 12/1991 | Poteet et al. | 307/296.8 |
| 5,083,045 | 1/1992 | Yim et al. | 307/296.1 |
| 5,097,146 | 3/1992 | Kowalski et al. | 307/363 |
| 5,111,136 | 5/1992 | Kawashima | 307/362 |
| 5,118,968 | 6/1992 | Douglas et al. | 307/362 |
| 5,208,488 | 5/1993 | Takiba et al. | 307/296.5 |
| 5,378,936 | 1/1995 | Kokubo et al. | 327/77 |

Primary Examiner—Timothy P. Callahan
Assistant Examiner—T. T. Lam
Attorney, Agent, or Firm—Armstrong, Westerman, Hattori, McLeland & Naughton

[57] ABSTRACT

A semiconductor integrated circuit device is intended to prevent generation of an unnecessary leak current and hence to reduce power consumption. In the semiconductor integrated circuit device comprising: a current path which is formed between a predetermined power source terminal (or a predetermined power source pad) and a predetermined low potential power source line, a comparison circuit for comparing a node potential in the current path with a predetermined threshold voltage to thereby detect whether the voltage applied to said power source terminal is a voltage which is larger than an upper limit value of the terminal voltage, a signal generation circuit for generating a predetermined logic signal when the states of some designated control terminals satisfy a combination which is determined in advance, if the logic state of an output signal of said signal generation circuit is a predetermined logic state when said comparison circuit has detected that the voltage applied to the power source terminal is a voltage which is larger than an upper limit value of the terminal voltage, a circuit equipped with a predetermined function mounted on the chip is activated, the semiconductor integrated circuit device being characterized by comprising ON/OFF circuit for turning on and off said current path in accordance with the logic state of the output signal of said signal generation circuit.

5 Claims, 10 Drawing Sheets

SEMICONDUCTOR INTEGRATED CIRCUIT DEVICE CAPABLE OF REDUCING POWER CONSUMPTION

This application is a continuation of application Ser. No. 08/507,686 filed Jul. 25, 1995, now abandoned, which is a continuation of application Ser. No. 08/272,615 filed Jul. 11, 1994, now abandoned, which is a continuation of application Ser. No. 08/099,423 filed Jul. 30, 1993, now abandoned.

BACKGROUND OF THE INVENTION

1. Field of the Invention

The present invention relates to a semiconductor integrated circuit device, and more particularly, to an improved technique which is effective in reducing the power consumption of a dynamic random access memory (DRAM) which comprises a super-high or a super-low voltage detection circuit.

2. Description of the Related Art

In recent years, as a semiconductor integrated circuit devices have become more advanced a each device is becoming increasingly multi-functional. However, due to a limit in the number of terminals, it is also becoming difficult to assign control signals for switching these functions to the terminals. To deal with this, as is done in a DRAM for example, a combination of a plurality of control signals is used. That is, (1) upon detection of a state in which a column address strobe signal (CAS) has fallen at a preselected set-up time prior to the fall of a row address strobe signal (RAS) to an L level, i.e., the so called "CAS-before-RAS" state (hereinafter abbreviated as CBR), refresh mode is invoked, or (2) if a state in which a write enable signal (WE) has fallen at a preselected set-up time prior to the fall of the RAS to L level, the so called "WE-before-RAS" state is detected at the same that the CBR state is detected (hereinafter abbreviated as WBR), a predetermined test mode which is available to a user is invoked. Alternatively, (3) upon detection of a state wherein the CBR state and the WBR state are concurrently satisfied (hereinafter abbreviated as WCBR), if it is detected that a voltage which is applied to a predetermined power source terminal is at a super high level, in other words, if the applied voltage exceeds an upper limit power source voltage value which is determined according to the JEDEC (Joint Electron Device Engineering Council), the EIAJ (Electronic Industry Association of Japan) or other well established standards (i.e., a 10% larger (5.5V) voltage if the power source is a 5V power source), a special test mode which is not available to a user is invoked.

In this manner, various functions are selectively invoked such as the refresh mode, the predetermined test mode and the special test mode without using terminals which are provided especially for the selection of functions.

FIG. 5 is a view showing the structure of a conventional detection circuit for detecting the super-high voltage condition (hereinafter referred to as "a super-high detection circuit"). In FIG. 5, indicated at reference numeral 1 is a predetermined power source terminal (or a predetermined power source pad) which receives a power source voltage $V_{cc}$ to be detected (5V power source in this case) and indicated at reference numeral 2 is a voltage drop circuit which is formed by n MOS transistors $T_1$ to $T_n$ which are diode-connected. Due to the voltage drop circuit 2, a voltage Va which is lower than the potential of $V_{cc}$ by $n \times V_{th}$ ($V_{th}$ is a threshold voltage of the MOS transistors) is available at a node Na. When the node voltage Va exceeds a threshold voltage $V_{INV}$ of an invertor 4 ($V_{INV} \approx 1.5V$), an output of an invertor 5 becomes H level. At this occasion, if the WCBR is at H level (i.e., the state (3) described above), from an AND gate 6, an H level super-high detection signal S/H is outputted. Indicated at reference character $T_{sw}$ is a MOS transistor for switching which stays conductive while the power source is supplied to the chip.

However, in such a conventional semiconductor integrated circuit device, while power source is supplied to the chip, a leak current $I_L$ keeps flowing all the times through the voltage drop circuit 2 and the switching MOS transistor $T_{sw}$. Hence, in terms of suppression of power consumption, the conventional semiconductor integrated circuit device is not satisfactory and needs improvement.

SUMMARY OF THE INVENTION

It is an object of the present invention to avoid generation of an unnecessary leakage current to thereby reduce consumption power.

To achieve this object, the present invention adopts the following basic technical structure. That is, a semiconductor integrated circuit device according to the present invention comprises: a current path which is formed between a first terminal which receives a predetermined power source voltage and a second terminal which receives a potential which is different from the power source voltage which is given to the first terminal; comparison means for comparing a predetermined threshold voltage with a potential at a predetermined node which is formed in the current path to thereby detect whether the power source voltage given to the first or the second terminal is larger or smaller than the predetermined power source voltage; signal generation means for generating a predetermined logic signal when one of a plurality designated types of control signal output terminals satisfies a certain condition or when combination of the control signal output terminals coincides with combination which is determined in advance; activation means for activating a specified particular circuit which is equipped with a predetermined function if the logic state of an output signal of said signal generation means is a predetermined logic state when said comparison circuit has detected that the power source voltage given to the first or the second terminal is larger or smaller than the predetermined power source voltage; and switch means for turning on and off said current path in accordance with the state of an output of at least one of said control terminals on said current path or the logic state of the output signal of said signal generation means.

That is, according to the present invention, the switch means turns on to thereby form the current path only while combination of the conditions of some designated control terminals coincides with a predetermined combination (for instance, the WCBR state described earlier). Hence, there will be no unnecessary leakage current and thus reduced power consumption.

DETAILED DESCRIPTION OF THE PREFERRED EMBODIMENTS

In the following, a semiconductor integrated circuit device according to an embodiment of the present invention will be described in detail with reference to the drawings.

FIGS. 1 to 4 are views showing a semiconductor integrated circuit device according to an embodiment of the present invention. The illustrated example is an application of the present invention to a DRAM.

Figure 1:
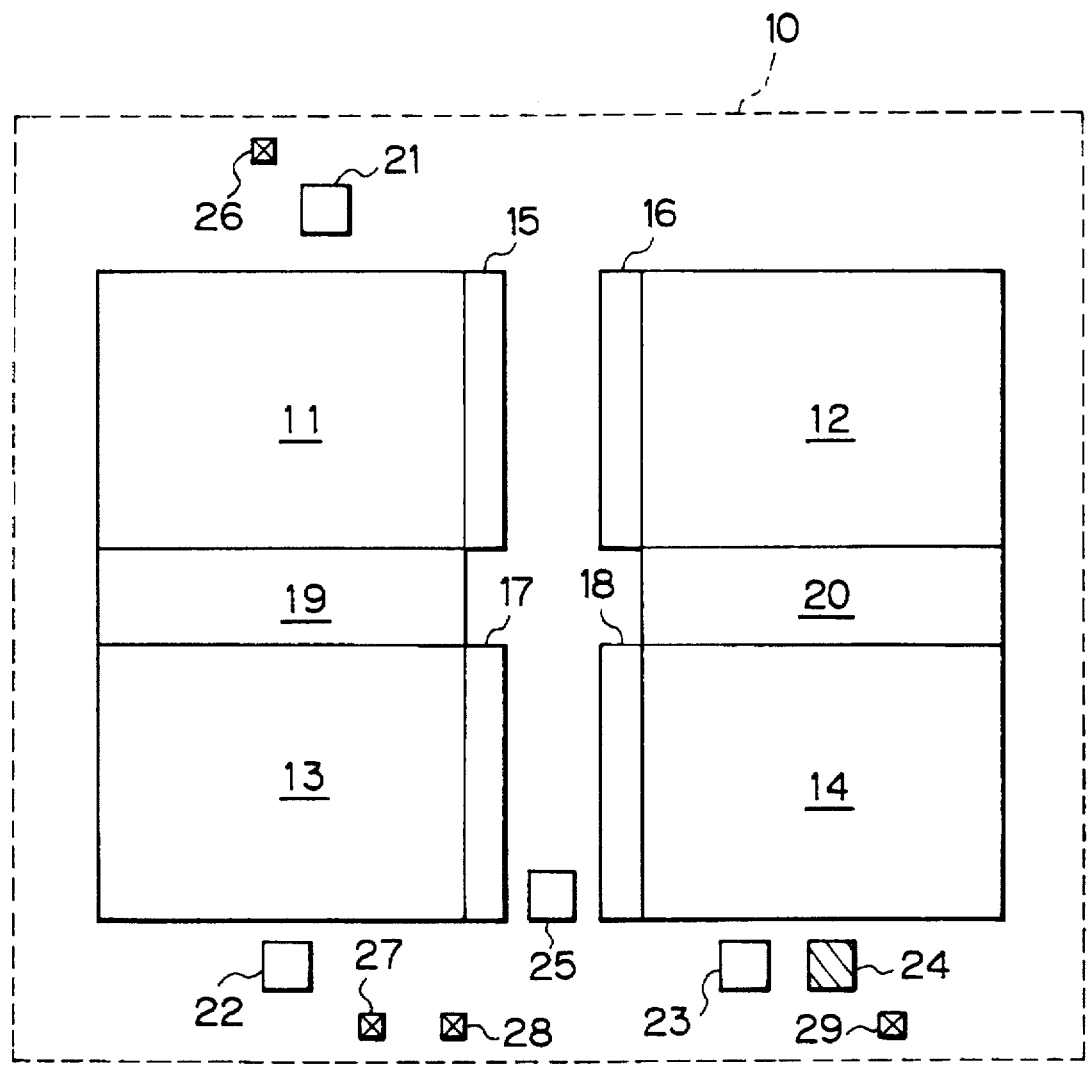
FIG. 1 is a chip layout view according to an embodiment of the present invention.

First, the layout concept of the DRAM of this embodiment will be described with reference to FIG. 1. Indicated at reference numeral 10 is a chip. On the chip 10, memory cell arrays 11 to 14, column decodes 15 to 18, word decoders 19 and 20 and other primary components are provided. In addition, peripheral circuits such as a first judge circuit 21 for judging the CBR state, a second judge circuit 22 for judging the WBR state, a signal generation circuit 23 for generating a WCBR signal, a detection circuit 24 for detecting super high and a mode select circuit 25 for selecting one of various test modes which include at least a predetermined test mode which is open to a user and a special test mode which is not open to a user are formed. Indicated at reference numeral 26 is a pad for providing a column address strobe signal (CAS), indicated at reference numeral 27 is a pad for providing a write enable signal (WE), indicated at reference numeral 28 is a pad for providing a row address strobe signal (RAS), and indicated at reference numeral 29 is a power source pad for providing a power source $V_{cc}$. FIG. 1 omits elements which have no direct relevance to the invention such as an address buffer, a sense amplifier and a control circuit.

Figure 2:
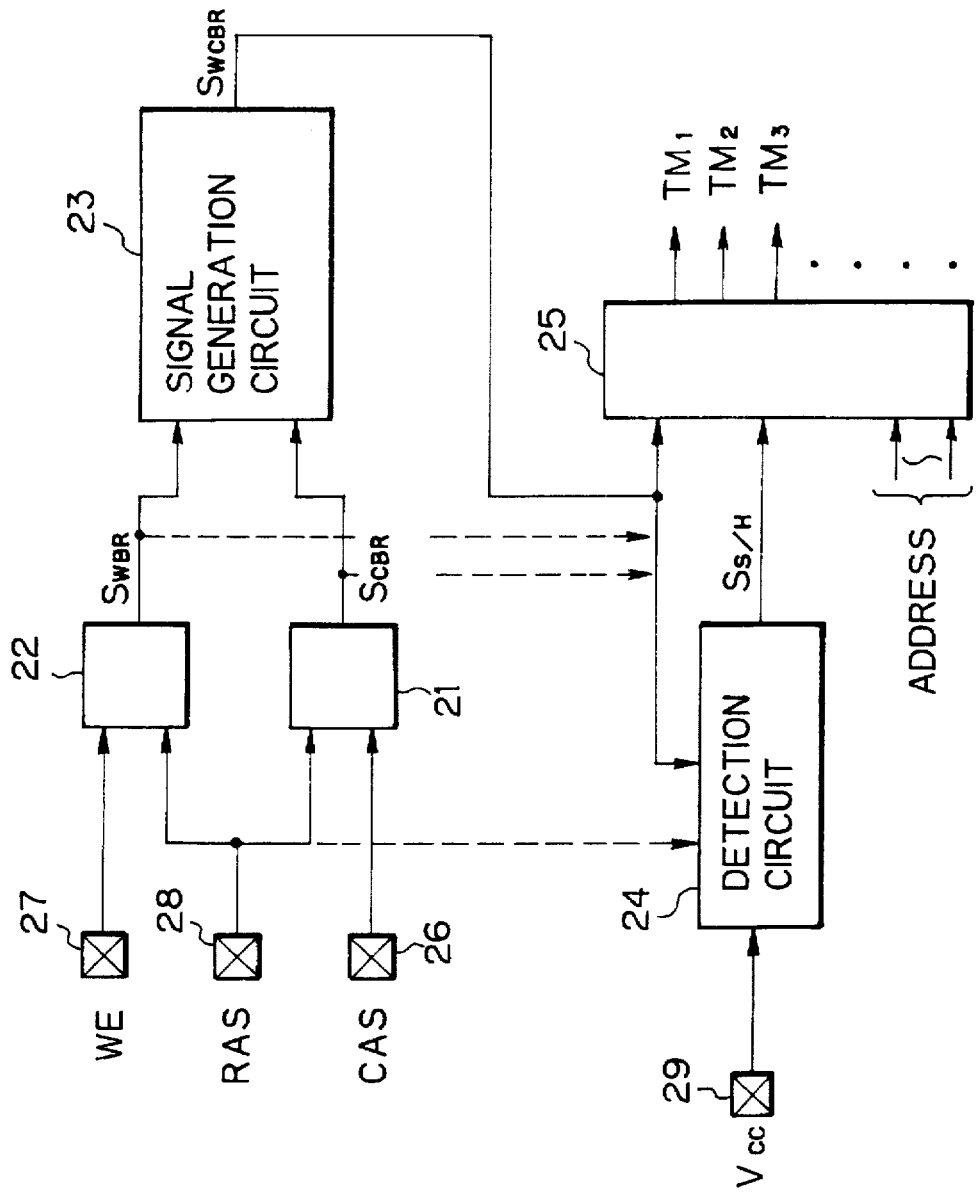
FIG. 2 is a view showing signal connection between peripheral circuits and pads according to the embodiment of the present invention.

FIG. 2 is a view showing signal connections between the respective peripheral circuits 21 to 25 and the pads 26 to 29. Upon fall of the signal RAS after a predetermined time period from fall of the signal CAS, the circuit 21 detects the CAS-before-RAS state and activates a signal $S_{CBR}$ which indicates the CAS-before-RAS state. The circuit 22, upon fall of the signal RAS after a predetermined time period from fall of the signal WE, detects the WE-before-RAS state and activates a signal $S_{WBR}$ which indicates the WE-before-RAS state. When both the signal $S_{CBR}$ and the signal $S_{WBR}$ are active, that is, when both CAS-before-RAS state and the WE-before-RAS state are satisfied (WCBR state), the signal generation circuit 23 activates a signal $S_{WCBR}$ which indicates the WCBR state. The detection circuit 24 detects whether the potential of the power source $V_{cc}$ is a voltage which exceeds an upper limit which is determined according to the JEDEC or EIAJ standards (i.e., if it is a 10% larger (5.5V) when the power source is 5V). If the potential of the power source $V_{cc}$ is larger than the upper limit, in other words, if the potential is super high, the detection circuit 24 activates a signal $S_{S/H}$. In addition, in accordance with a combination of the signal $S_{WCBR}$, the signal $S_{S/H}$ and an address signal, the mode select circuit 25 activates one of signals $TM_1, TM_2, TM_3, \ldots$ each selecting a predetermined circuit operation function. For instance, when the signal $TM_1$ is active, the predetermined user test mode is invoked and when the signal $TM_2$ is active, the special test mode which is not available to a user (e.g., a test mode for fabrication test) is invoked.

Next, a description will be given of detecting a super-high voltage in the semiconductor integrated circuit device according to the present invention.

Figure 3:
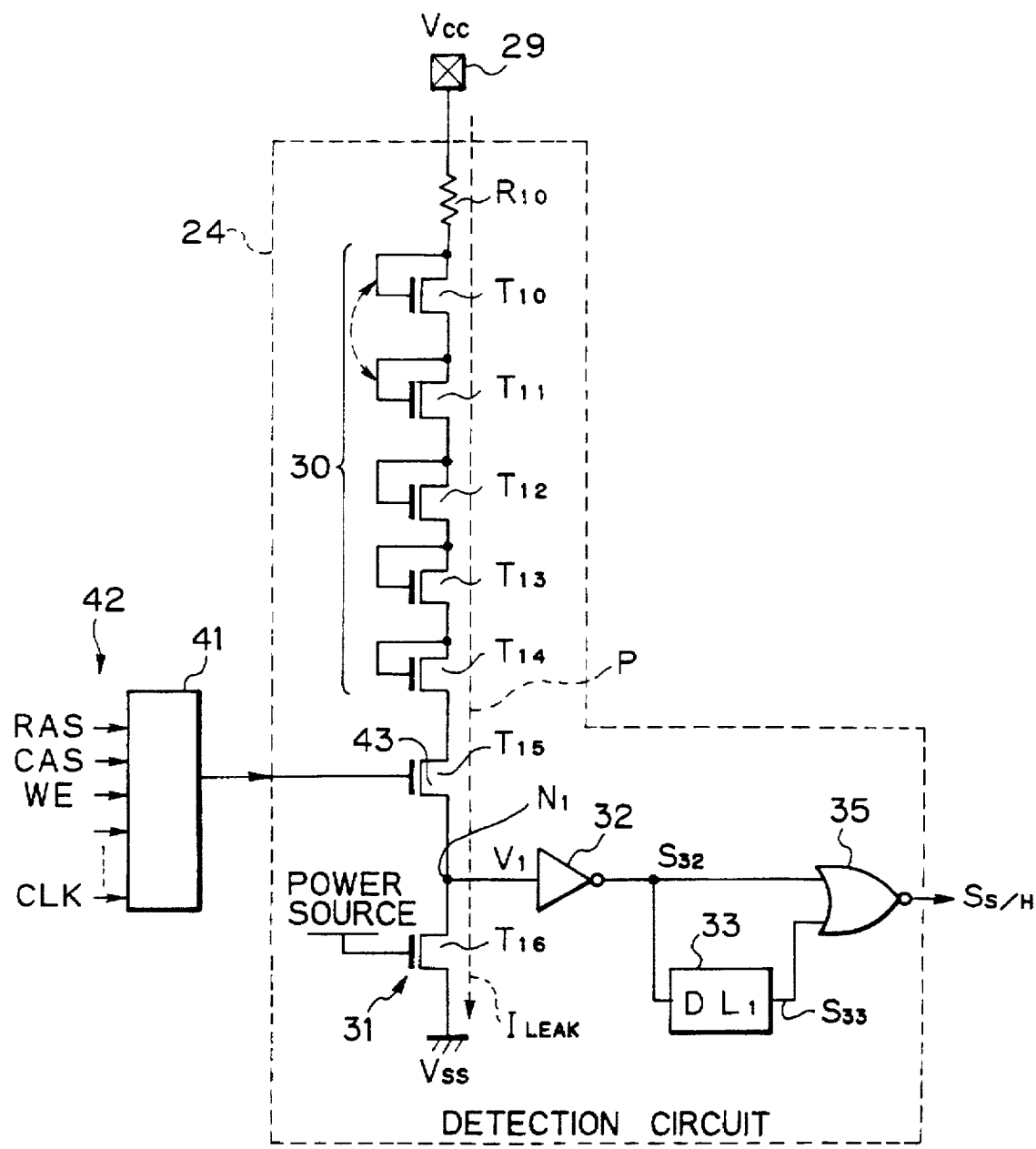
FIG. 3 is a view showing the structure of a detection circuit according to the embodiment of the present invention.

FIG. 3 is a view showing the structure of the detection circuit for detecting a super-high voltage according to the embodiment of the present invention. In FIG. 3, there is illustrated a detection circuit 24 on the semiconductor integrated circuit device comprising: a current path P which is formed between a power source pad 29 or a first input terminal which receives a predetermined power source voltage, and a predetermined power source line $V_{ss}$ or a second input terminal which receives a potential which is different from the power source voltage which is applied to the power source pad 29 or the first input terminal; comparison means 32 for comparing a predetermined threshold voltage with a potential $N_1$ at a predetermined node which is formed in the current path P to thereby detect whether the power source voltage given to the first or the second terminal 29 or 40 is larger or smaller than the predetermined power source voltage; signal generation means 41 for generating a predetermined logic signal when one of a plurality of designated types of control signal output terminals 42 satisfies a certain condition or when combination of the control signal output terminals 42 coincides with combination which is determined in advance; activation means 35 for activating a specified particular circuit which is equipped with a predetermined function if the logic state of an output signal of said signal generation means 41 is a predetermined logic state when said comparison circuit has detected that the power source voltage given to the first or the second terminal is larger or smaller than the predetermined power source voltage; and switch means 43 for turning on and off said current path in accordance with the state of an output of at least one of said control terminals on said current path P or the logic state of the output signal of said signal generation means.

In the following, a more detailed description will be given on the detection circuit 24 of FIG. 3 which is used in the semiconductor integrated circuit device according to the present invention. That is, in FIG. 3, indicated at reference character $R_{10}$ is a resistor for suppressing a pass through current. A plurality of MOS transistors which form, as a whole, a voltage drop circuit 30 are indicated at $T_{10}$ to $T_{14}$ (five MOS transistors are used here). Indicated at reference character $T_{15}$ is a MOS transistor which forms the switch means 43 and which serves as ON/OFF means which turns on when the signal $S_{WCBR}$ is active (H level). Indicated at reference character $T_{16}$ is a MOS transistor which turns on during supply of power source (e.g., $V_{cc}$) to the chip to thereby initiate a current at the node $N_1$ and consequently develop a voltage so that the voltage generation means 31 which serves as a resistor is realized. The resistor $R_{10}$, the voltage drop circuit 30 and the two MOS transistors $T_{15}$ and $T_{16}$ in combination form the current path P between the power source pad 29, or a first input terminal, and a predetermined low power source line $V_{ss}$, or a second input terminal. Although one end of the current path P is connected to the power source pad 29 in the embodiment, the one end of the current path P may be connected to a predetermined power source terminal instead of the power source pad 29. Alternatively, the power source pad 29 may be a temporary pad to which a test probe is brought into contact.

The current path P allows a leak current $I_{LEAK}$ to flow from the pad 29 to $V_{ss}$ during conductive state of the two MOS transistors $T_{15}$ and $T_{16}$ and non-conductive state of the voltage drop circuit 30, to thereby develop at the node $N_1$ between the two MOS transistors $T_{15}$ and $T_{16}$ a voltage $V_1$ which is lower than, but in proportion to, the voltage which is applied to the pad 29 (i.e., $V_{cc}$). The voltage $V_1$ is lower than $V_{cc}$ by a predetermined potential. More precisely, subtraction of the sum of the threshold voltages of the MOS transistors $T_{10}$ to $T_{14}$ of the voltage drop circuit 30 ($5 \times V_{th} \approx 5V$) from $V_{cc}$ is the voltage $V_1$. The voltage $V_1$ is set at any desired value by providing many voltage drop circuits 30 in advance and connecting gates of some of adjacent voltage drop circuits 30.

The structure of the semiconductor integrated circuit device according to the present invention heretofore described is merely one embodiment of the present invention. A number of various technical modifications can be made to the present invention without departing from the basic technical structure of the present invention described above.

For instance, although the super-high voltage is detected in the embodiment above, a super-low voltage may be detected instead which is rather lower than a voltage with which the semiconductor integrated circuit device of the present invention is used under normal circumstances. In such a case, a certain operation mode is invoked by operating a certain circuit of the semiconductor integrated circuit device at the super-low voltage.

The first terminal of the semiconductor integrated circuit device of the present invention may be a power source which itself has a predetermined voltage, or may be connected to other terminal having a predetermined voltage so as to receive the predetermined voltage. The same is also true of the second terminal. However, a power source voltage received by the second terminal needs to be set lower than that received by the first terminal. If the voltage given to the first terminal is $V_{cc}$ or higher, for example, the voltage given to the second terminal is preferably $V_{ss}$ or GND.

In addition, although FIG. 3 shows an example wherein the voltage drop circuit 30 is formed by a plurality of MOSFET transistors $T_{10}$ to $T_{14}$, the voltage drop circuit 30 may be formed by resistors alone, or a flip-flop circuit, or a current mirror circuit or the like.

FIGS. 6 to 9 show alternative circuit constructions for detecting the super-high voltage, used in the present invention other than the one as shown in FIG. 3, for example.

Figure 6:
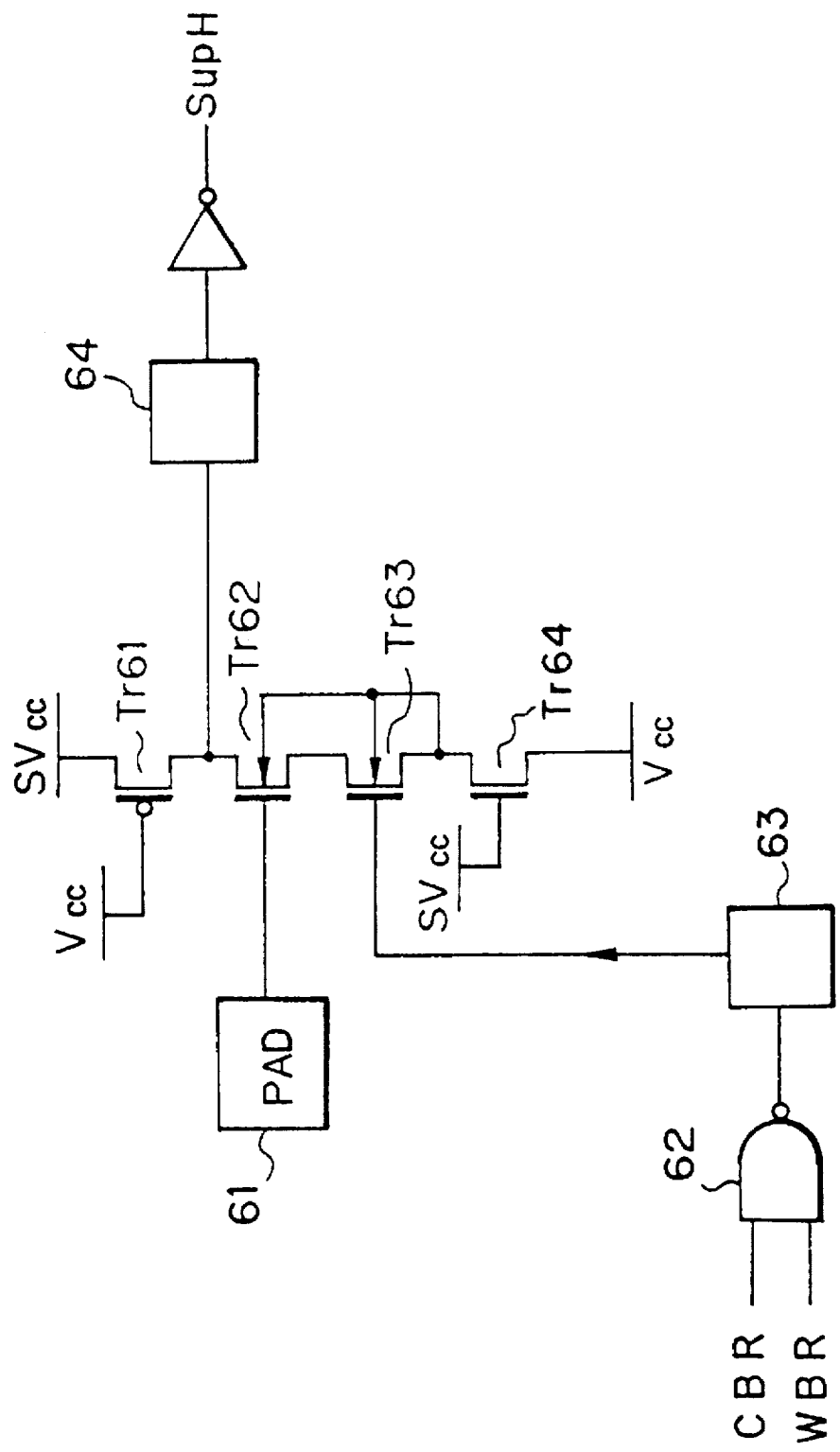
FIGS. 6 to 9 show circuit constructions of other embodiments of the detection circuit used in the present invention.

FIG. 6 shows a super-high voltage detecting circuit in which serially arranged four transistors Tr 61 to Tr 64 are provided between a first voltage source having $SV_{cc}$ and a second voltage source having $V_{cc}$ and the voltage $V_{cc}$ is applied to a gate of the transistor Tr 61 while the voltage $SV_{cc}$ is applied to a gate of the transistor Tr 64.

Further, in that a pad portion 61 is connected to a gate of the transistor Tr 62, while an output of a NAND gate circuit 62 to which both signals of CBR and WBR, as mentioned above, are input, is connected to a gate of the transistor Tr 63 through a voltage conversion circuit 63 whereby a level of the voltage output from the NAND gate circuit 62 is converted to a level of $SV_{cc}$.

Moreover, the detection voltage is detected from a node portion formed between the transistors Tr 61 and Tr 62 through an amplitude level conversion circuit 64 in which an amplitude level formed between $V_{cc}$ and $SV_{cc}$ is converted to an amplitude level formed between $V_{ss}$ and $SV_{cc}$.

In FIG. 6, $SV_{cc}$ represents the voltage level of $V_{cc} + \alpha$ (positive number), which is always generated inside the chip.

Accordingly, when the voltage level at the PAD portion 61 exceeds $SV_{cc}$, the super high voltage level SUPH is generated.

In this situation, however, the amplitude of the logic voltage level is formed between the $V_{cc}$ level and $SV_{cc}$ level and thus the amplitude of thereof should be converted to the level formed between $V_{ss}$ level and $SV_{cc}$ level by the converter 64.

Figure 7:
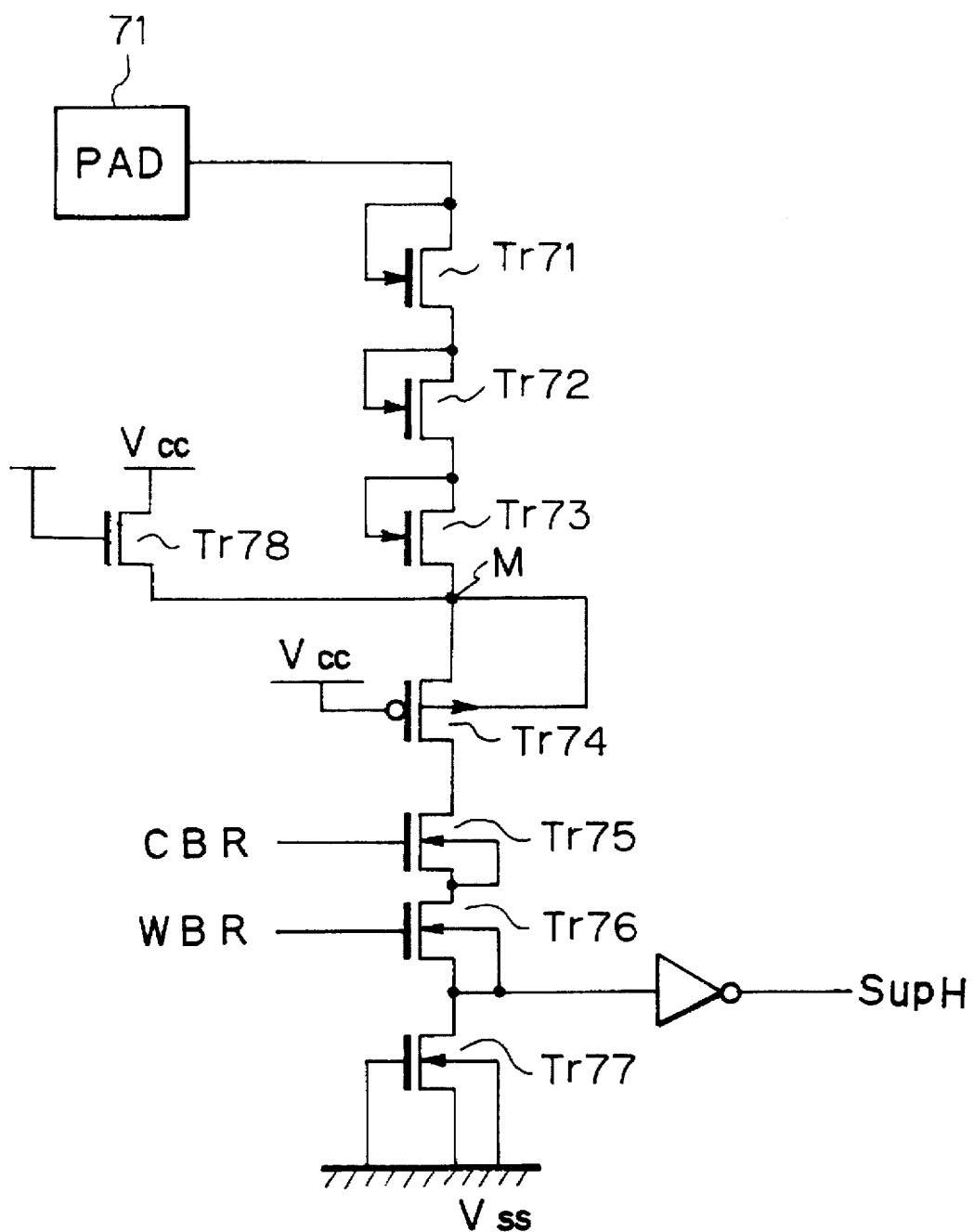

FIG. 7 shows another super-high voltage detecting circuit in which seven serially arranged transistors Tr 71 to Tr 77 are provided between a pad portion 71 serving as first voltage source having voltage level of $SV_{cc}$ and $V_{cc}$, and a second voltage source having voltage level of $V_{ss}$.

On the other hand, the voltage $V_{cc}$ is applied to a gate of the transistor Tr 74, while the voltage $V_{cc}$ is also applied to a node portion formed between the transistors Tr 73 and Tr 74 through a transistor Tr 78.

Further, the above-mentioned signals of CBR and WBR are input to gates of the transistors Tr 75 and Tr 76, respectively.

Moreover, the detection voltage is detected from a node portion formed between the transistors Tr 76 and Tr 77.

In FIG. 7, when the output voltage level of the PAD portion 71 is less than the voltage level of $V_{cc} + 3 V_{th}$, no current is flown through the current line formed between the PAD portion 71 and $V_{ss}$.

On the other hand, when the voltage level of the PAD portion 71 exceeds the voltage level of $V_{cc} + 3 V_{th}$, the potential of the node portion M is increased and thereby the super high voltage level SUPH is generated.

Figure 8:
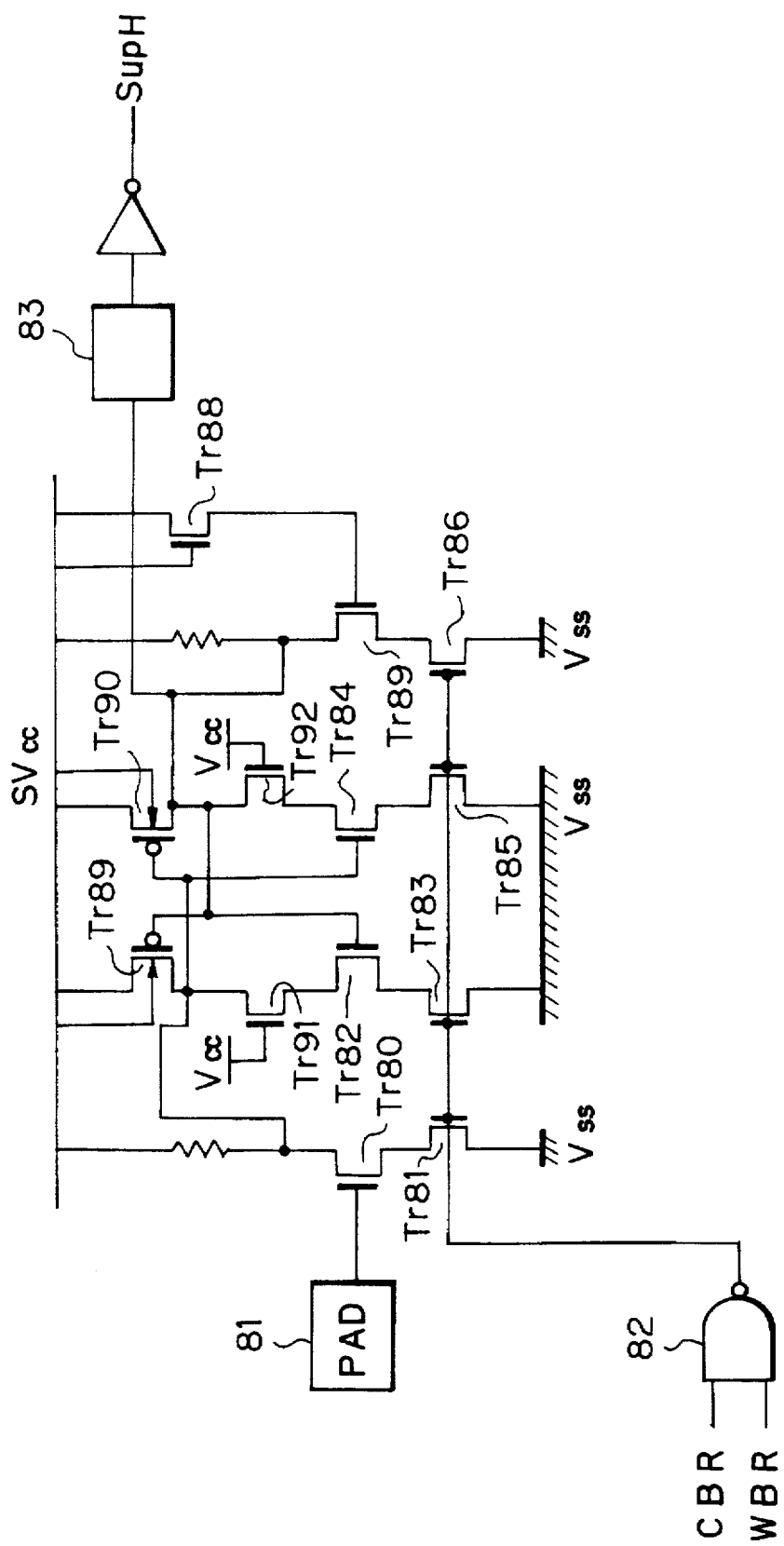

FIG. 8 shows another super-high voltage detecting circuit in which a plurality of transistors Tr 81 to Tr 92 are provided and arranged as shown in this drawing, between a first voltage source having a voltage of $SV_{cc}$ and a second voltage source having a voltage of $V_{ss}$.

In FIG. 8, a pad portion 81 is connected to a gate of the transistor Tr 80, while an output of a NAND gate circuit 82 to which both signals of CBR and WBR, as mentioned above, are input, is connected to a gates of the transistors Tr 81, Tr 83, Tr 85 and Tr 86, simultaneously.

Moreover, the detection voltage is detected from a node portion formed between the transistors Tr 90 and Tr 92 through a voltage level conversion circuit 83 in which the voltage level of $SV_{cc}$ is converted to the voltage level of $V_{cc}$.

In FIG. 8, the voltage level of $SV_{cc} - V_{th}$ is simply compared with the output voltage level of the PAD portion 81 but the amplitude of the voltage level thereof is formed between $SV_{cc}$ level of and $V_{ss}$ level and thus the conversion circuit 83 to convert the amplitude level formed between $SV_{cc}$ and $V_{ss}$ level to the amplitude level formed between $V_{cc}$ level and $V_{ss}$ level.

Figure 9:
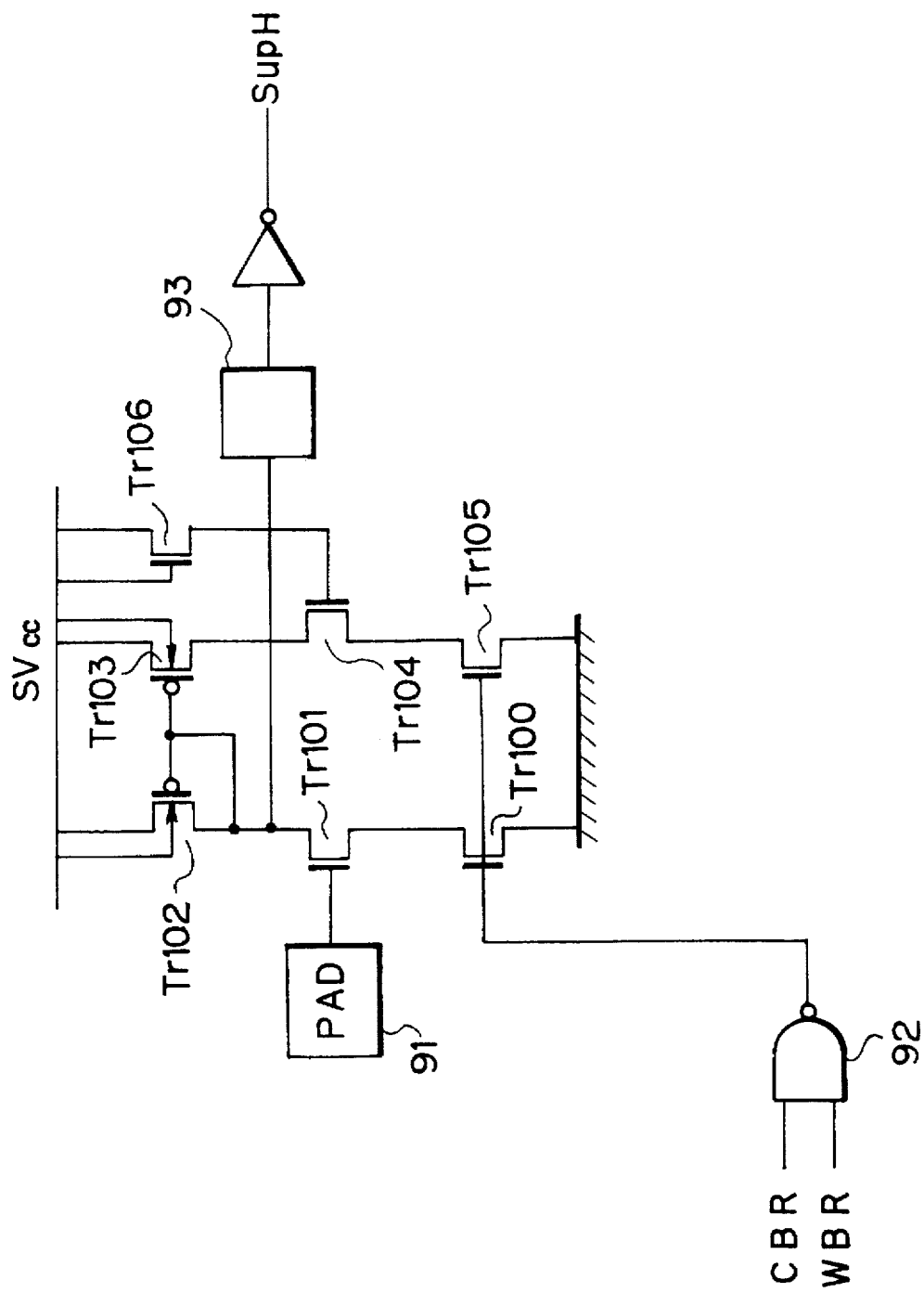

FIG. 9 shows another super-high voltage detecting circuit in which a plurality of transistors Tr 100 to Tr 106 are provided and arranged as shown in this drawing, between a first voltage source having a voltage of $SV_{cc}$ and a second voltage source having a voltage of $V_{ss}$.

In FIG. 9, a pad portion 91 is connected to a gate of the transistor Tr 101, while an output of a NAND gate circuit 92, to which both signals of CBR and WBR, as mentioned above, are input, is connected to a gates of the transistors Tr 100 and Tr 105, simultaneously.

Moreover, the detection voltage is detected from a node portion formed between the transistors Tr 102 and Tr 101 through a voltage level conversion circuit 93 in which the voltage level of $SV_{cc}$ is converted to the voltage level of $V_{cc}$.

In FIG. 9, the detecting method is similar to that as shown in FIG. 8 but actual operation of the detecting method in FIG. 9 is carried out with a current mirror circuit.

Further, needless to mention, the MOSFET transistor $T_{16}$ which is disposed in the current path P as the voltage generation means 31 may be formed by a resistor. On the other hand, the switch means 43 of the present embodiment is formed by the MOSFET transistor $T_{15}$ and its gate is connected to an output of the signal generation means 41 which outputs an active output in response to formation of predetermined logic. As shown in FIG. 2, the signal generation means 41 has input terminals which are formed by a plurality types of control signal output terminals such as a row address strobe (RAS) control signal terminal, a column address strobe (CAS) control signal terminal and a write enable (WE) control signal terminal. An output of the signal generation means 41 may be at least selected one of control signal outputs of these control signal terminals.

Moreover, in accordance with the circuit structure of FIG. 2, the output of the signal generation means 41 may be combination of at least two signals which are selected from the control signal outputs of these control signal terminals.

That is, as can be seen in FIG. 2, the output of the signal generation means 41 may be combination of the column address strobe (CAS) control signal and the row address strobe (RAS) control signal, i.e., a CAS-before-RAS (CBR) signal ($S_{CBR}$) having predetermined logic, or combination of the row address strobe (RAS) control signal and the write enable (WE) control signal, i.e., a WE-before-RAS (WBR) signal ($S_{WBR}$) having predetermined logic, or combination of said CBR signal ($S_{CBR}$) and said WBR signal ($S_{WBR}$), i.e., an AND logic WBR (WCBR).

For example, when the row address strobe (RAS) control signal alone is used as the output of the signal generation means 41, it is desirable that a signal which indicates a function of time is also used.

Figure 10:
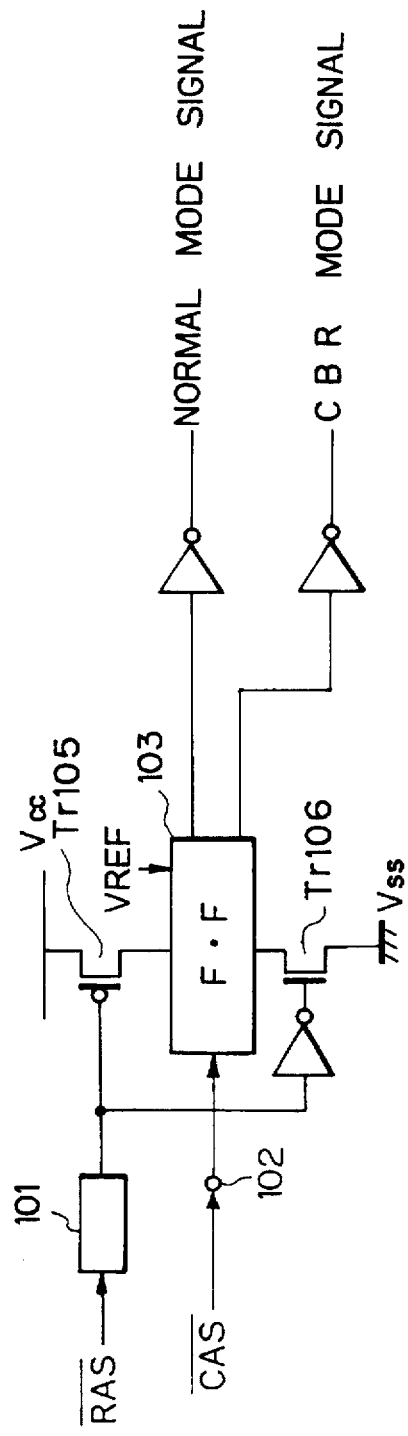
FIGS. 10 to 12 show circuit constructions of other embodiments of logic signal generating means which can be used in the present invention.

FIG. 10 shows another embodiment of a circuit for generating the CBR mode signal used in the present invention.

In that, two transistors Tr 105 and Tr 106 and a flip-flop circuit 103 are serially arranged as shown in this drawing and provided between a first voltage source $V_{cc}$ and a second voltage source $V_{ss}$.

An output of a pulse generating circuit 101, to which $\overline{RAS}$ signal (RAS bar signal) is input, is connected to both gates of the transistors Tr 105 and Tr 106, respectively, and an input terminal 102 to which $\overline{CAS}$ signal (CAS bar signal) is input, is connected to the flip-flop circuit 103 from which the CBR mode signal is output.

In FIG. 10, the flip-flop circuit 103 detects the potential of the CAS bar signal with reference to the reference voltage level $V_{REF}$.

Further in FIG. 10, transistors Tr 105 and Tr 106, which are arranged at an upper portion and a down portion of the flip-flop circuit 103 serve as electric power source for the flip-flop circuit 103.

Therefore, when RAS bar signal ($\overline{RAS}$) arrives at this CBR circuit, the flip-flop circuit 103 generates a pulse to latch the condition of the $\overline{CAS}$ signal.

Figure 11:
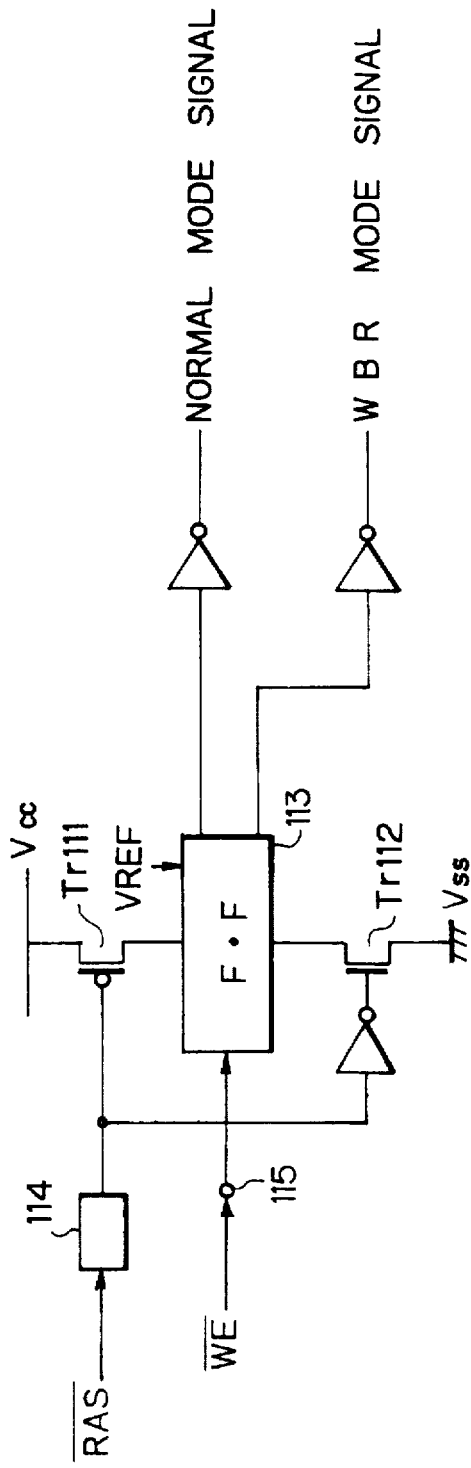

FIG. 11 shows another embodiment of a circuit for generating the WBR mode signal used in the present invention.

In FIG. 11, two transistors Tr 111 and Tr 112 and a flip-flop circuit 113 are serially arranged as shown in this drawing and provided between a first voltage source $V_{cc}$ and a second voltage source $V_{ss}$.

An output of a pulse generating circuit 114, to which $\overline{RAS}$ signal (RAS bar signal) is input, is connected to both gates of the transistors Tr 111 and Tr 112, respectively, and an pad portion 115 to which $\overline{WE}$ signal (Write Enable bar signal) is input, is connected to the flip-flop circuit 113 from which the WBR mode signal is output.

In FIG. 11, when the $\overline{RAS}$ signal arrives at the WBR circuit, the flip-flop circuit 113 generates a pulse to latch the condition of the $\overline{WE}$ signal.

Figure 12:
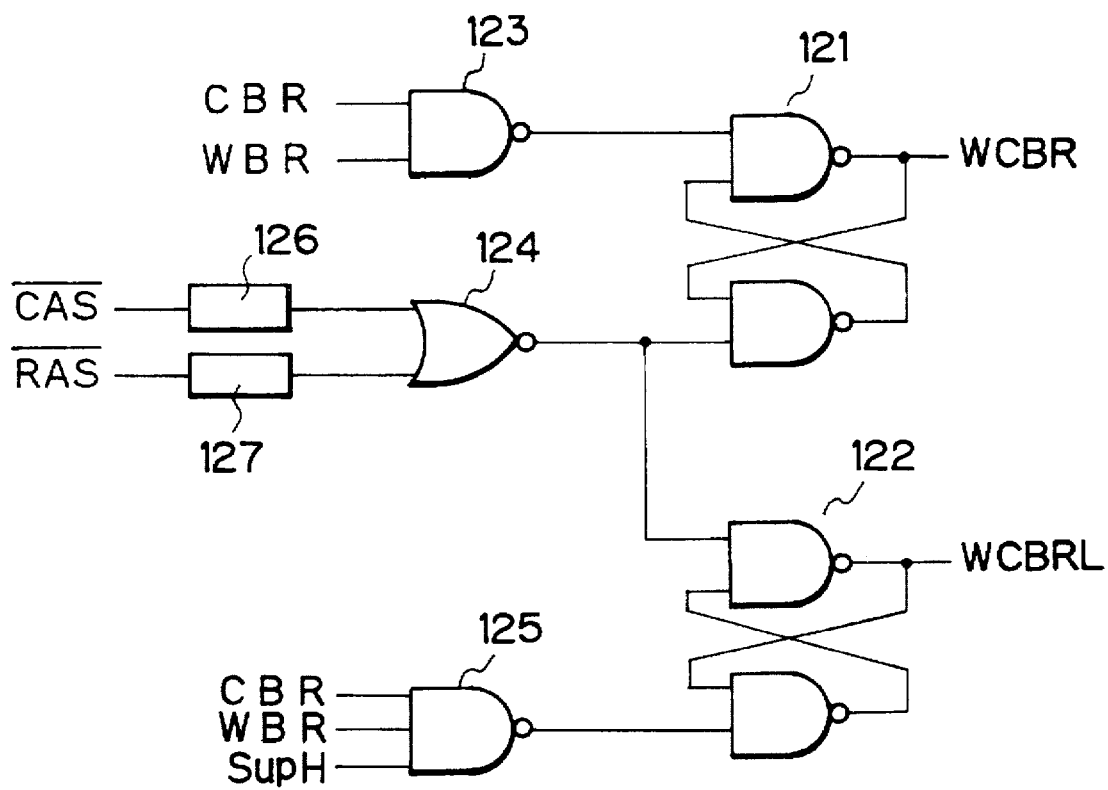

FIG. 12 shows another embodiment of a circuit for generating the WCBR mode signal used in the present invention.

In FIG. 12, two edge trigger circuits 121 and 122 are provided and an output of a NAND gate circuit 123 to which both signals of CBR and WBR as mentioned above, are input, is connected to the edge trigger circuit 121.

On the other hand, an output of a NAND gate circuit 125 to which signals of CBR, WBR and SUPH as mentioned above, are input, is connected to the edge trigger circuit 122.

Moreover, an output of a NOR gate circuit 124, to which both signals for $\overline{RAS}$ and $\overline{CAS}$ are input through pulse generating circuits 126 and 127, respectively, is connected to both of the flip-flop circuits 121 and 122.

In FIG. 12, when both CBR and WBR conditions are created, the WCBR condition is set by this edge trigger circuit 121.

In the same manner, when all of the CBR, WBR and SUPH conditions are simultaneously created, the WCBRL condition is set by this edge trigger circuit 122.

On the other hand, since the NOR signal of the $\overline{CAS}$ signal and the $\overline{RAS}$ signal is input to one of the input terminal of the edge trigger circuits 121 and 122, even when any one of the $\overline{CAS}$ signal and the $\overline{RAS}$ signal is in non-active condition, the setting condition of the WCBR or WCBRL can be reset.

Further, when use of the signal $S_{CBR}$ or the signal $S_{WBR}$ is desired, the two signals are preferably used as combination or with the super-high or super-low signal supplied to the DRAM, and with some other signal which indicates a good timing.

The comparison circuit 32 of the present invention is connected to the node part $N_1$ which is disposed at a proper position on the current path mentioned earlier. The comparison circuit 32 detects the potential at the node part $N_1$ reaching a voltage which corresponds to a super-high voltage which is applied to the first terminal 29.

This structure is not limited to any particular structure. An invertor may be used which has a threshold voltage which is equal to the voltage which corresponds to a super-high voltage which is applied to the first terminal 29, or alternatively, a regular comparator may be used.

The predetermined voltage which is compared by the comparison means 32 of the present invention is the upper limit or the lower limit of a normal rated voltage at which the circuit operates normally, and hence, is a voltage which is necessary for execution of special modes such as a test mode. This voltage is not known to a user in most cases but used in a predetermined test by a manufacturer.

For instance, this predetermined voltage may exceed the maximum normal rated voltage value of the circuit.

Figure 4:
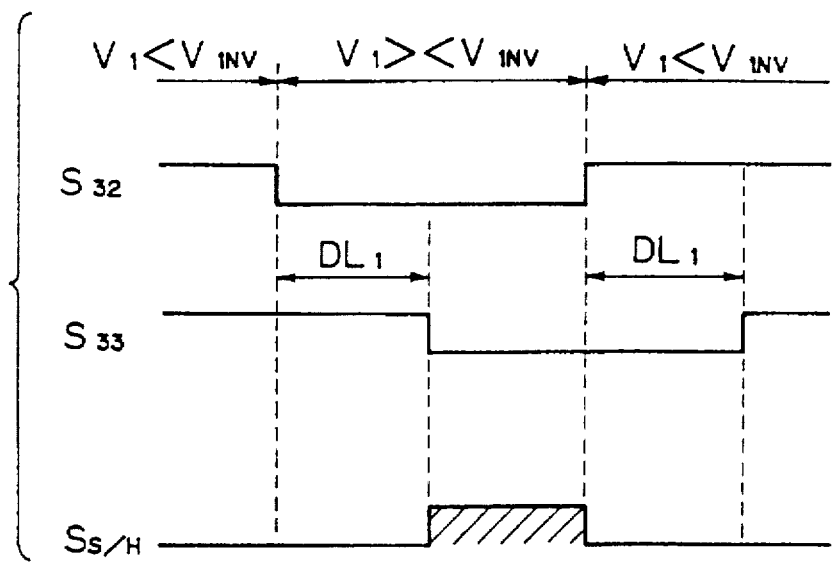
FIG. 4 is a waveform diagram of the detection circuit according to the embodiment of the present invention.
Figure 5:
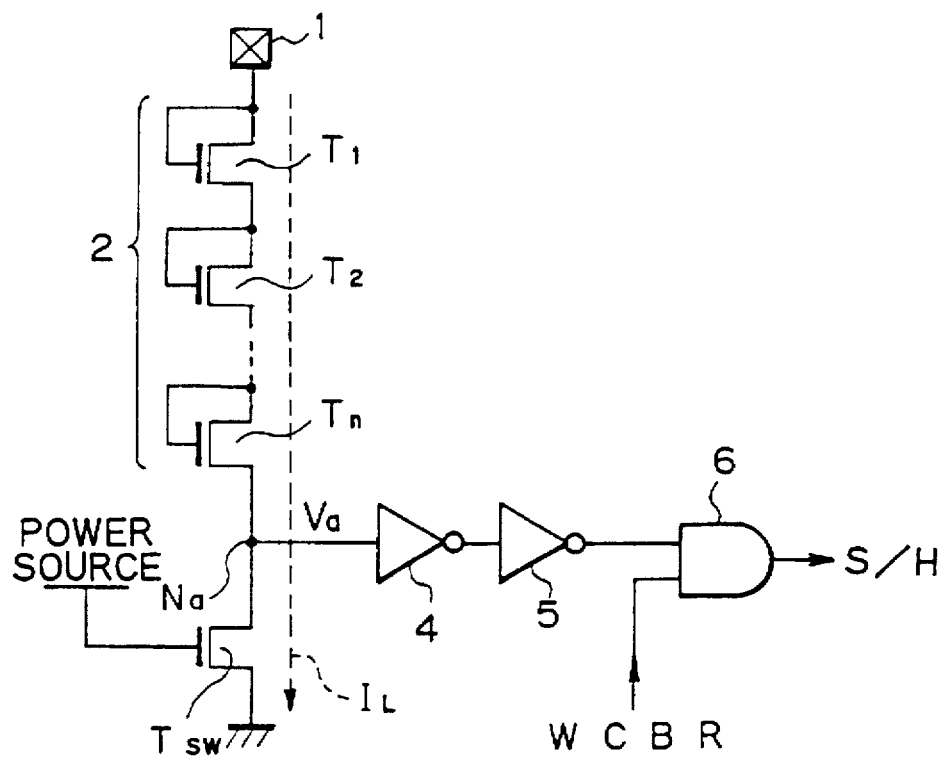
FIG. 5 is a view showing a conventional structure.

The invertor gate 32 outputs a signal $S_{32}$ which goes H level when the voltage $V_1$ is lower than the threshold voltage $V_{INV}$ ($\approx 1.5$V) ($V_1 < V_{INV}$) and goes L level when the voltage $V_1$ is higher than the threshold voltage $V_{INV}$ ($V_1 > V_{INV}$). The delay circuit 33 outputs a signal $S_{33}$ which is obtainable by delaying the signal $S_{32}$ by a predetermined time delay $DL_1$. The two-input NOR gate 35 outputs a super-high voltage detection signal $S_{S/H}$ which goes to the H level during an L level period of both the signals $S_{32}$ and $S_{33}$ as shown in FIG. 4. That is, the signal $S_{S/H}$ rises in the time delay $DL_1$ when the applied voltage at the pad 29 rises to a super-high voltage ($V_1 > V_{INV}$) and falls when the voltage at the pad 29 falls from super-high voltage ($V_1 < V_{INV}$).

Table 1 below shows the states of the signals $S_{CBR}$, $S_{WBR}$, $S_{WCBR}$ and $S_{S/H}$ of 1 when both the CAS-before-RAS state (CBR) and the WE-before-RAS state (WBR) and 2 when in addition to this, the voltage applied to the pad 29 exceeds the upper limit which is determined according to the JEDEC or EIAJ standards (i.e., super high).

TABLE 1

|   | $S_{CBR}$ | $S_{WBR}$ | $S_{WCBR}$ | $S_{S/H}$ |
|---|---|---|---|---|
| 1 | active | active | active |  |
| 2 | active | active | active | active |

As can be understood from Table 1, the signal $S_{WCBR}$ becomes active when any of the states 1 and 2 is satisfied. On the other hand, the super high detection signal $S_{S/H}$ becomes active only when the state 2 is satisfied, and therefore, can invoke different test modes under the states 1 and 2.

In the present invention, examples of the different test modes are as follows:

(1) a test for a chip carried out by compressing data to be used in the chip, with a ratio of 1/16, and in that, one set of data corresponding to 16M bits are compared with reference data, inside a chip in one step, and the comparison data is output, immediately;

(2) a test for checking an initial-write-function in which the same initial data is simultaneously set at designated cells, word lines or cell-blocks, respectively; and (3) a test for checking an output voltage at respective output terminal provided in a chip, and in which, a voltage of a certain device formed inside the chip is output through a pad portion.

In addition, according to the present embodiment, since the current path 31 includes the MOS transistor $T_{15}$ which turns on when the signal $S_{WCBR}$ is active, that is, when both the CAS-before-RAS state (CBR) and the WE-before-RAS state (WBR) are satisfied, it is possible to allow the leak current $I_{LEAK}$ to flow only when there is a possibility that the super-high voltage has occurred. Hence, creation of unnecessary leak current $I_{LEAK}$ is prevented, thereby reducing power consumption.

Thus, according to the present invention, since the current path is turned on only when the states of the some designated control terminals satisfy the preliminarily determined combination, it is possible to prevent generation of unnecessary leak current $I_{LEAK}$ and hence to reduce power consumption.

The activation means 35 according to the present invention is not limited to any particular structure. Any circuit structure may be adopted as far as being capable of receiving an output of the comparison circuit 32 and outputting an instruction signal which calls for a test mode in response to the super-high voltage. In the present embodiment, as the activation means 35, an AND gate circuit which creates an AND of the output $S_{33}$ of the delay circuit 33 and the output $S_{32}$ of the comparison circuit 32. Alternatively, a buffer which receives the output $S_{32}$ of the comparison circuit 32 may be used as the activation means 35.

We claim:

1. A semiconductor integrated circuit device, comprising:

a current path which is formed between a first terminal capable of receiving a predetermined power source voltage and a second terminal capable of receiving a potential which is different from the power source voltage which is received by the first terminal;

comparison means, operably connected to the current path, for comparing a predetermined threshold voltage with a potential at a node which is formed in the current path to thereby detect whether an actual power source voltage received by the first or the second terminal is larger or smaller than the predetermined threshold voltage;

logic signal generation means, operably connected to the current path, for generating a predetermined logic signal at one of: (1) a condition when one of a plurality of designated types of control signal output terminals satisfies a certain condition, wherein said plurality of designated types of control signal output terminals include at least one terminal for receiving at least three signals, said at least three signals being at least a row address strobe signal (RAS), a column address strobe signal (CAS), and a write enable signal (WE), and (2) another condition when the combination of the plurality of designated types of control signal output terminals coincides with a combination which is determined in advance, activation means, operably connected to the comparison means, for activating a specified particular circuit which is equipped with a predetermined function when said predetermined logic signal is at a predetermined logic state and when said comparison means has detected that the actual power source voltage received by the first or the second terminal is larger or smaller than the predetermined threshold voltage; and switch means, within the current path, operably connected to the logic signal generation means, for turning on and off said current path in accordance with said predetermined logic signal.

2. A semiconductor integrated circuit device in accordance with claim 1, wherein the first terminal is a high-potential power source and the second terminal is a low-potential power source.

3. A semiconductor integrated circuit device in accordance with claim 1, wherein the predetermined power source voltage which is used as a reference voltage in a comparison which is performed by the comparison means is the maximum normal rated voltage value of the semiconductor integrated circuit.

4. A semiconductor integrated circuit device in accordance with claim 1, wherein the combination of the plurality of designated types of control signal output terminals is at least a combination of CAS-before-RAS state (CBR) and WE-before-RAS state (WBR) or combination of CBR and WBR (WCBR).

5. A semiconductor integrated circuit device in accordance with claim 1, wherein the particular circuit which is equipped with a predetermined function is a circuit for setting a test mode in a set of circuits which are mounted on the chip.

* * * * *